(12) United States Patent
Shin et al.

(10) Patent No.: US 7,872,321 B2
(45) Date of Patent: Jan. 18, 2011

(54) HYBRID SEMICONDUCTOR-FERROMAGNET DEVICE WITH A JUNCTION STRUCTURE OF POSITIVE AND NEGATIVE MAGNETIC-FIELD REGIONS

(75) Inventors: Kyung-Ho Shin, Seoul (KR); Jim-Ki Hong, Seoul (KR); Sung-Jung Joo, Seoul (KR); Kung-Won Rhie, Daejeon (KR)

(73) Assignee: Korea Institute of Science and Technology (KR)

( * ) Notice: Subject to any disclaimer, the term of this patent is extended or adjusted under 35 U.S.C. 154(b) by 1107 days.

(21) Appl. No.: 11/557,326

(22) Filed: Nov. 7, 2006

(65) Prior Publication Data

US 2008/0048179 A1 Feb. 28, 2008

(30) Foreign Application Priority Data

Aug. 22, 2006 (KR) ...................... 10-2006-0079567

(51) Int. Cl.
*H01L 29/82* (2006.01)
(52) U.S. Cl. ............................ 257/421; 257/422; 438/3
(58) Field of Classification Search .................. 257/20, 257/414, 421–427, E29.323; 438/3; 365/157–158, 365/171–173; 360/324–326; 29/737
See application file for complete search history.

(56) References Cited

U.S. PATENT DOCUMENTS

2004/0178460 A1* 9/2004 Lee et al. ..................... 257/421

OTHER PUBLICATIONS

Sungjung Joo, "*Asymmetric Magnetoresistance In A Double Magnetic Barrier Device*", Journal of the Korean Physical Society, vol. 48, No. 4, Apr. 15, 2006, pp. 642-647.

* cited by examiner

*Primary Examiner*—Bradley K Smith
*Assistant Examiner*—Jami M Valentine
(74) *Attorney, Agent, or Firm*—Ostrolenk Faber LLP

(57) ABSTRACT

A hybrid semiconductor-ferromagnet device is a device which has micromagnets (Co) deposited on semiconductor (InAs) two-dimensional electrons, and which has a junction structure of positive and negative magnetic field regions using a stray field resulting from the micromagnets. The magnetoresistance measured in the hybrid semiconductor-ferromagnet device has an asymmetrical hall resistance profile, and a change in magnetoresistance thereof is very large. The measured data is well consistent with the calculated results using a diffusive mode and a ballistic model.

22 Claims, 7 Drawing Sheets

HYBRID SEMICONDUCTOR-FERROMAGNET DEVICE WITH A JUNCTION STRUCTURE OF POSITIVE AND NEGATIVE MAGNETIC-FIELD REGIONS

RELATED APPLICATION

The present disclosure relates to subject matter contained in priority Korean Application No. 10-2006-0079567, filed on Aug. 22, 2006, which is herein expressly incorporated by reference in its entirety.

BACKGROUND OF THE INVENTION

1. Field of the Invention

The present invention relates to a hybrid semiconductor-ferromagnet device with a junction structure of positive and negative magnetic-field regions.

2. Description of the Background Art

Hybrid semiconductor-ferromagnet devices have been spotlighted as devices applicable in the fields, such as magnetic field-sensors, non-volatile memory devices, spintronics, etc., which are recently attracting attentions. Especially, sensors based on the magnetoresistance of hybrid semiconductor-ferromagnet devices are next generation technologies which may be essential for the technologies of high-density data storage and position/speed monitoring devices. In such devices, the motion of the electrons in the semiconductor can be controlled by using local nonhomogeneous magnetic fields.

Another magnetic-field sensors that have been recently highlighted include GMR and TMR devices. However, these devices have drawbacks in some applications. Especially, in the fields of biomolecule sensors using magnetic beads that have been recently highlighted, the device suggested in the present invention shows superior performance to the GMR and TMR devices.

Recently, Solin et al. reported an extraordinary magnetoresistance (EMR) device. The EMR device shows a high MR, but it requires a very low contact resistance between the semiconductor and the metal and is not easy to fabricate.

The hybrid ferromagnet-semiconductor devices reported up to now have been devices in which a positive local magnetic field region and a negative local magnetic field region are separated from each other, even if local magnetic fields are one-directional, or local magnetic fields of opposite directions are formed on a single device, and in which voltage probes for sensing the amplitude of signals are located regardless of the direction of local magnetic fields.

SUMMARY OF THE INVENTION

Therefore, an object of the present invention is to provide a hybrid semiconductor-ferromagnet device which has a junction structure of two magnetic-field regions because local magnetic field regions with opposite directions are located near to each other.

Additionally, another object of the present invention is to suggest a hybrid semiconductor-ferromagnet device of a new type in which voltage probes are located at positive and negative magnetic field regions, respectively.

The device fabricated according to the present invention shows superior performance to existing devices, and can be applied to the fields of MRAM, spintronics, biomolecule sensors, etc. as well as magnetic-field sensors.

To achieve these and other advantages and in accordance with the purpose of the present invention, as embodied and broadly described herein, there is provided a hybrid semiconductor-ferromagnet device with a junction structure of positive and negative magnetic field regions according to one aspect of the present invention, including: two micromagnets with a predetermined interval on the same plane located on a semiconductor 2DEG (2-Dimensional Electron Gas) having a channel, through which current flows; and two magnetic barriers with different signs formed in the semiconductor under the portion where the two micromagnets face each other.

At this time, there may be included positive and negative voltage probes that are connected to the positive and negative magnetic field regions of one side of the channel. Preferably, the positive and negative voltage probes are formed at the positions corresponding to the minimum and maximum heights, respectively, of the magnetic barriers.

Preferably, the semiconductor 2DEG include InAs or HgCdTe. In this case, the junction surface between the positive and negative magnetic field regions may be a spin up-down junction of electrons.

Furthermore, there is provided a hybrid semiconductor-ferromagnet device with a junction structure of positive and negative magnetic field regions according to another aspect of the present invention, including: micromagnets intersecting a channel, through which current flows, located on a semiconductor 2DEG having the channel; and two magnetic barriers with different signs formed in the semiconductor under the micromagnets as an external magnetic field is applied.

Furthermore, there is provided a hybrid semiconductor-ferromagnet device with a junction structure of positive and negative magnetic field regions according to still another aspect of the present invention, including a semiconductor 2DEG having a channel, through which current flows, and a plurality of voltage probes perpendicularly connected to one side of the channel; and micromagnets located alternately on the channel area between the two neighboring voltage probes.

Preferably, the two neighboring voltage probes are formed at the positions corresponding to the minimum and maximum heights, respectively, of two magnetic barriers with different signs that are formed in the channel as an external magnetic field is applied.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
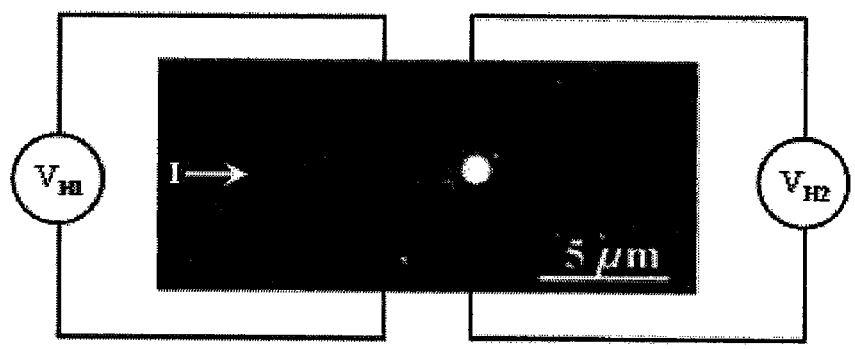
FIG. 1 is a one-dimensional array structure of a conventional biomolecule sensor using a hole element, in which a voltage probe ($V_H$) for sensing a signal and a current channel forms a cross shape, and this cross region functions as a unit sensor.

Hereinafter, embodiments of a hybrid semiconductor-ferromagnet device according to the present invention will be described in detail with reference to the accompanying drawings.

A device targeted by the present invention is a spin diode and transistor based on a spin up/down junction. An unipolar spin transistor is based on the concept of "spin junction" rather than "spin injection, and is not of an inhomogeneous junction structure but of a homogeneous structure, which is discriminated from other spin devices from the aspect that it is a device that requires not spin injection.

To fabricate such a unipolar spin diode and transistor, a spin up/down junction has to be formed. For instance, a magnetic semiconductor having ferromagnetism can realize a spin up/down junction as a junction of domains with opposite spin directions. Ruster et al., discovered a giant magnetoresistance by fabricating a magnetic semiconductor device constituting a kind of spin up/down junction structure using nanoconstrictions of GaMnAs wires. However, such a magnetic semiconductor has so large a density of carriers that it cannot be an effective diode. That is, since the magnetic semiconductor is a degenerated semiconductor whose Fermi level lies below the valance band, it is close to a metal rather than a semiconductor and thus, cannot function as a spin diode or transistor.

In case that a magnetic semiconductor is used for a spin up/down junction, as described above, since the magnetic semiconductor is a degenerated semiconductor whose Fermi level lies below the valance band, it is close to a metal rather than a semiconductor and thus, cannot function as a spin diode or transistor. Hence, for a unipolar spin transistor, a non-degenerated semiconductor having a relatively small density of carriers, i.e., a semiconductor whose Fermi level lies in a band gap, is required, however, all the semiconductors that have represented spontaneous magnetization up to now are degenerated semiconductors as exemplified above. Therefore, in order to form an effective unipolar spin diode, it is preferable to use a semiconductor having a large spin separation due to an externally magnetic field, i.e., a semiconductor having a large paramagnetism. In the present invention, a semiconductor having a large paramagnetism because of the Zeeman effect, i.e., a semiconductor having a large g-factor is used.

Meanwhile, some DMS (Dilute Magnetic Semiconductors) have a very large g-factor by an exchange interaction between magnetic ions and electrons in a material. However, if there exist magnetic ions in a material, it is difficult to use it as an effective spin junction device because of a very short spin relaxation time. Consequently, a semiconductor having a large g-factor and no magnetic ions is suitable as the material preferred for a unipolar spin diode or transistor.

In order to form a spin up/down junction by the Zeeman effect, firstly, a junction structure of positive and negative magnetic field regions is required. That is, first, when a junction of positive and negative magnetic field regions is formed at a semiconductor having a large g-factor, a spin separation occurs at each junction region by a large Zeeman effect to thus form a junction of two regions whose majority carriers have a spin up/down orientation. Such a spin junction is a spin diode corresponding to a typical pn junction diode, and a negative-positive-negative junction structure formed by repeating negative and positive magnetic field regions becomes a unipolar spin transistor corresponding to a pnp junction transistor.

A micromagnet is properly located on a sample, and a stray field resulting therefrom is used, so that a local magnetic field can be formed by positive and negative magnetic field regions. Namely, a hybrid semiconductor-ferromagnet device is fabricated by depositing a magnetic material of a proper shape and size on a semiconductor.

The present invention involves the formation and control of a junction structure of positive and negative magnetic field regions which can be said to be essential for such a spin junction structure. To inspect such a structure, a magnetoresistance measurement method is commonly used. In the junction structure of positive and negative magnetic field regions, charge of the carriers perform orbital motion by the Lorentz force caused by a magnetic field, which is represented as a unique magnetoresistance Sample Fabrication and Measurement A hybrid semiconductor-ferromagnet device of a new type is fabricated in the present invention in order to form a junction structure of positive and negative magnetic field regions.

The existing hybrid ferromagnet-semiconductor devices have had a single magnetic barrier, while the present invention implements a junction structure of positive and negative magnetic field regions by forming two magnetic barriers with different directions and locating voltage probes at the positions corresponding to the minimum and maximum heights of the magnetic barriers.

Figure 2:
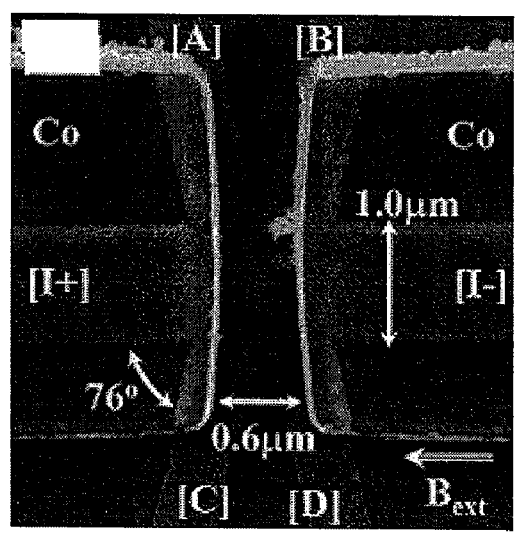
FIG. 2 is a SEM image of a hybrid semiconductor-ferromagnet device (S1 sample) according to one embodiment of the present invention.

Referring to FIG. 2, the hybrid semiconductor-ferromagnet device according to one embodiment of the present invention has a micromagnet located on an InAs 2-Dimensional Electron Gas (hereinafter, referred to as "2DEG").

Figure 3:
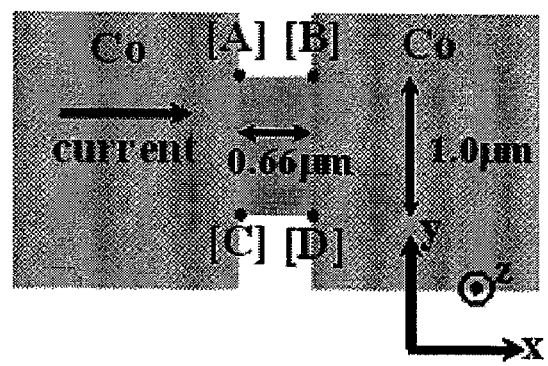
FIG. 3 is a model for the calculation based on the diffusive transport for the S1 sample as shown in FIG. 2.

The InAs 2DEG has a Hall-bar shape. The voltage probes ([A],[B],[C],[D]) are tilted to the channel having two current terminals ([I+],[I−]) so that the angle between the voltage probe and the current terminal is about 76°. The adjacent voltage probes are formed in a "V"-shape so that the "average distance" therebetween is consistent with the position at which the height of the magnetic barrier is the maximum and minimum. In a computer simulation using a diffusive model for the fabricated sample, as shown in FIG. 3, it is assumed that the adjacent voltage probes are separated as much as an "average distance", and it is considered from that the idea of "average distance" is applied well when viewing the good consistency between the computer simulation and the measurement results. Alternatively, the voltage probes may be formed so as to be perpendicular to the channel, rather than being formed in a "V"-shape. In this embodiment, although the channel and the voltage probes are formed integrally, the present invention is not limited thereto but they may be formed separately and connected to each other.

As the semiconductor 2DEG used in the present invention, typical semiconductors 2DEG such as HgCdTe, Si, GaAs, InGaAs, etc. as well as In As, can be used. Among them, in case of a semiconductor, such as InAs or HgCdTe, having a large g-factor and a small density of electrons, a positive and negative junction structure of magnetic fields is equal to a spin up/down junction structure, thus it is preferred to use InAs having a smaller density of electrons than those used so far. This is because an InAs-based device can be applied well to spin separation or spin junction devices because it shows excellent MR property even at room temperature and has a large spin sensitivity to a magnetic field. Alternatively, HgCdTe having a far larger spin sensitivity (g-factor) to a magnetic field than other semiconductors can be used. HgCdTe has good intrinsic properties as a spin device because it may have a spin polarization of 57 meV in a magnetic field of 1 Tesla, and a very long spin life (356 ps at 150K).

Cobalt (Co) micromagnets with a thickness of 300 nm and a length of 20 μm are formed on the surface of the InAs mesa by sputtering. The micromagnets used in the present invention may include CoPt, CoFe, FeNi, CoFeB, CoZrB, and FePt, as well as Co. Two types of samples have been fabricated. In sample S1 (see FIG. 2), the widths of the current channel (current terminal) and the voltage probe are 1.0 μm and 0.5 μm, respectively, and the smaller sides of the two rectangular-shaped micromagnets are located in the middle of voltage probes with a 0.66 μm gap between the two micromagnets. Preferably, the width of the micromagnets is larger than the width of the channel so that a magnetic barrier can be uniformly formed on the vertical cross section of the channel. Preferably, the distance between the two micromagnets is 0.1 to 1.0 μm. In this device, the strength of the magnetic field must be changed abruptly at the positive and negative junction. However, if the distance between the two micromagnets is larger than 1.0 μm, a junction whose change in the magnetic field is slow is formed to thereby degrade the device performance. If the distance therebetween is smaller than 0.1 μm, the magnetic field produced from the micromagnets is compensated for, to thereby degrade the performance of the device.

Figure 4:
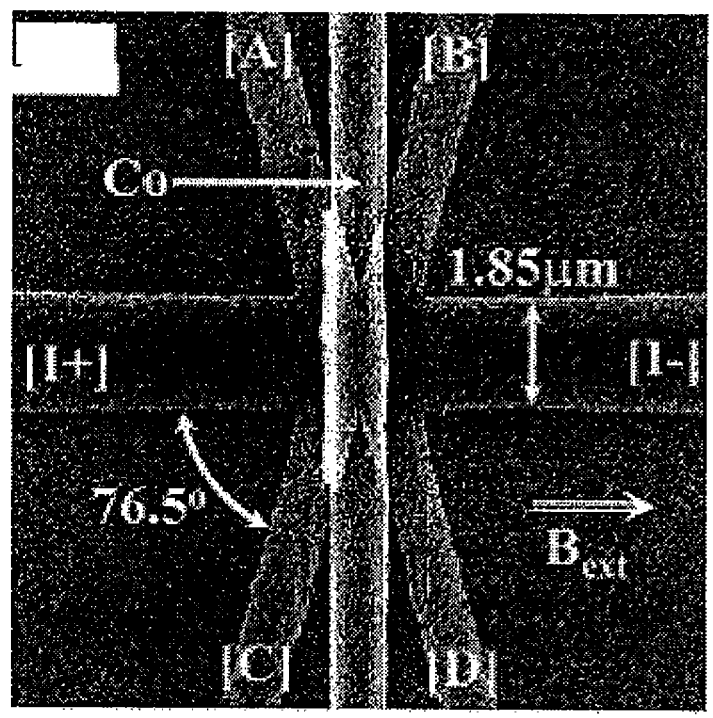
FIG. 4 is a SEM image of a hybrid semiconductor-ferromagnet device (S2 sample) according to one embodiment of the present invention.

FIG. 4 is a SEM photograph of sample S2 in which the widths of the channel and the voltage probe are 1.85 μm and 0.84 μm, respectively, and the two larger sides of a single rectangular-shaped micromagnet are located in the middle of voltage probes with a 0.93 μm distance between each side.

The InAs 2DEG resides 35.5 nm beneath the surface on which the micromagnets have been deposited. An insulating layer is interposed between the InAs 2DEG and the micromagnets. Preferably, the thickness of the insulating layer is smaller than the thickness of the micromagnets. Taking into account that the thickness of the micromagnets used in this embodiment is 300 nm, if the thickness of the insulating layer is larger than 300 nm, the sensitivity of the device is reduced to a large extent. The smaller the thickness of the insulating layer, the higher the sensitivity of the device. Therefore, if the micromagnets are insulating materials, no insulating layer is required, and the InAs 2DEG may be contacted with the micromagnets.

The resistance induced by an external magnetic field was measured by a lock-in technique using an AC of 1 μA at 98 Hz. The resistance was measured by a four terminal method using the voltage probes [A],[B],[C], and [D] while passing a current through terminal [I+] and [I−]. The mobility and the carrier density of both S1 and S2 are 7.86 m²/Vsec and $2.0 \times 10^{16}$ m$^{-2}$ respectively, at 2 K and 2.0 m²/Vsec and $2.1 \times 10^{16}$ m$^{-2}$ at 300K. Since the mean free path at 2 K, obtained from the mobility and the carrier density, is 1.85 μm, which is smaller than the size of S1, the transport phenomenon of S1 at 2 K can be treated as ballistic motion.

Figure 5:
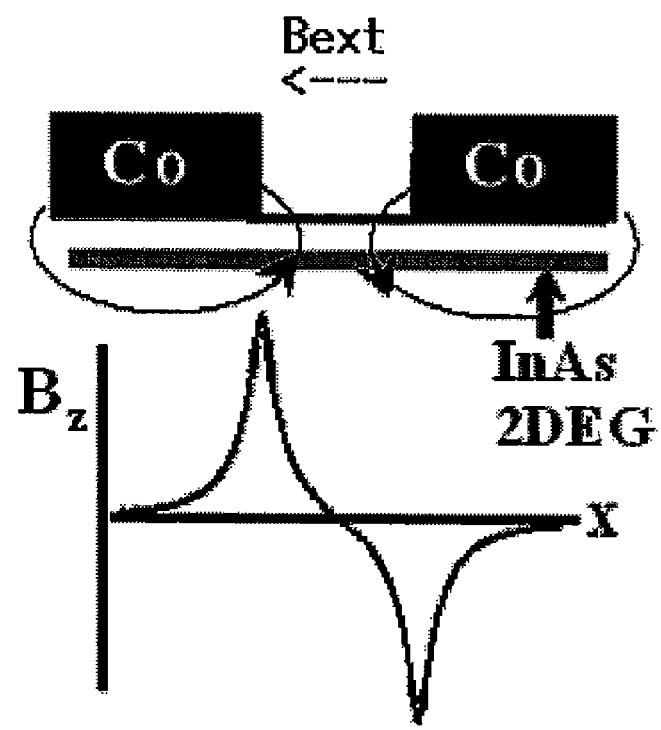
FIG. 5 is a schematic cross sectional view of the S1 sample as shown in FIG. 2 and a graph showing the amplitude of a normal component of a micromagnet spontaneously magnetized by an external magnetic field.

As FIG. 5 shows, when an external magnetic field ($B_{ext}$) is applied in parallel to the sample plane, the micromagnets are magnetized by this external magnetic field, the normal component ($B_z$) of the stray field at the two sides of the micromagnets makes two magnetic barriers with opposite sign. The magnetic field component parallel with the surface of the device does not contribute to magnetoresistance. Subsequently, the sample can be influenced by the normal component alone, so the carriers contributing to conductivity are only influenced by a magnetic barrier induced by the magnetization of the micromagnets.

Computer Simulation of Magnetoresistance

A computer simulation of magnetoresistance was carried out in order to examine the transport phenomenon for the measured results and acquire the fabrication condition of a sample capable of obtaining the maximum magnetoresistance effect.

Though carriers of the sample used in the experiment are electrons, for the convenience of calculation, we considered a system made of positively charged electrons (positrons) and a magnetic field profile with its sign opposite to the real one, which is equivalent to a real experimental condition.

Since the transport phenomenon can be divided into a diffusive model or a ballistic model depending on the relative size of the mean free path of the carriers and the relative size of sample, computer simulation was carried out in two ways. If the size of the mean free path is relatively larger than the size of sample, we used a ballistic transport model, and if not, we used a diffusive transport model.

In the diffusive model, the spatial distribution of the electrostatic potential ($\Phi$) and the current density (J) is obtained from a numerical calculation by using a finite-difference method. The continuity equation in steady state makes the current density divergence in the device:

$$\nabla \cdot J(x,y) = 0. \quad (1)$$

This equation is supplemented with Ohm's law $J = \sigma \cdot E$, where E is the electric field. In the presence of a magnetic field perpendicular to the plane, the conductivity ($\sigma$) becomes a two-dimensional tensor with magnetic-field-dependent components:

$$\sigma = \begin{pmatrix} \sigma_{xx} & \sigma_{xy} \\ -\sigma_{xy} & \sigma_{xx} \end{pmatrix} \begin{matrix} \sigma_{xx} = \sigma_0/(1+(\mu \cdot B_z(x))^2), \\ \sigma_{xy} = \sigma_{xx} \cdot (\mu \cdot B_z(x)), \end{matrix} \quad (2)$$

where $\mu$ is the mobility, $B_z$ is the local magnetic field perpendicular to the sample plane, and $\sigma$ is the conductivity when there is no magnetic field. When considering a local magnetic field such as a magnetic barrier, the components of the conductivity tensor will be spatially dependent. Moreover, in the steady state, we can write $E = -\nabla \cdot \Phi$, so the Equation (1) results in the following 2D elliptic partial differential equation:

$$\nabla \cdot [\sigma(x) \nabla \phi(x,y)] = 0, \quad (3)$$

which, when written in expanded form, becomes $$\frac{\partial}{\partial x}\left(\sigma_{xx}\frac{\partial \phi}{\partial x} + \sigma_{xy}\frac{\partial \phi}{\partial y}\right) + \frac{\partial}{\partial y}\left(\sigma_{xx}\frac{\partial \phi}{\partial y} - \sigma_{xy}\frac{\partial \phi}{\partial x}\right) = 0. \quad (4)$$

The electric potential distribution $\Phi(x,y)$, which is a solution of the equation (4), is obtained by using finite difference methods subject to mixed boundary conditions: the voltage difference between the two current contacts is constant, and the normal component of the current is zero at all boundaries of the system other than the current contacts. One of important physical quantities is the Hall angle ($\Phi_H$), which is the angle between the density of the current and the electric field. From Equation (2), a simple form of the Hall angle is given by $\Phi_H = \tan^{-1} \mu B_z$. A magnetoresistance caused by a ballistic model was calculated by using Landauer-Büttiker (LB) formula. The shape and size of the sample including voltage probes, as well as the spatial distribution of the magnetic field, are used as calculation parameters. The resistance is calculated by obtaining the trajectories of injected particles. In this calculation, we considered a system made of classical positrons caused by the Lorentz force. The particles injected at various positions and angles through current and voltage terminals move with a Fermi Velocity, and return to their own terminals or reach other terminals while drawing trajectories by the influence of the magnetic barriers and the reflection at the sample boundaries. The particles that reach the individual terminals are counted. This number is proportional to the corresponding transmission probability, from which the conductance is obtained. If particles are injected from the [q] terminal and reach the [p] terminal, the conductance ($G_{pq}$) is given as follows:

$$G_{pq} = \frac{2e^2}{h} \frac{W}{\lambda_F/2} T_{p \leftarrow q}, \quad (5)$$

where W is the width of the injection terminal, $\lambda_F$ the Fermi wavelength, and $T_{p \leftarrow q}$ is the transmission probability.

Experimental Results and Analysis

In the device fabricated in the present invention, two kinds of resistance measurements are possible, depending on voltage probes. In FIGS. 2 and 4, a conventional resistance $R_{AB}$ or $R_{CD}$ can be obtained by measuring the voltage difference between a pair of voltage probes [A] and [B] (or [C] and [D]) residing at one side of the device. A Hall resistance $R_{H,DB}$ or $R_{H,CA}$ of the sample, on the other hand, is measured with a pair of voltage probes [D] and [B] (or [C] and [A]) which are located on either side of the device. In this case, the magnetic field becomes the respective Hall resistances for positive and negative magnetic field regions.

Generally, the MR curve, including full hysteresis behavior, is an even function with respect to the external magnetic field. That is, when the resistance is placed on the y axis, and the external magnetic field is placed on the y axis, the resistance is symmetrical to the y axis. On the other hand, the Hall resistance is an odd function, and symmetrical to the origin.

Figure 6A:
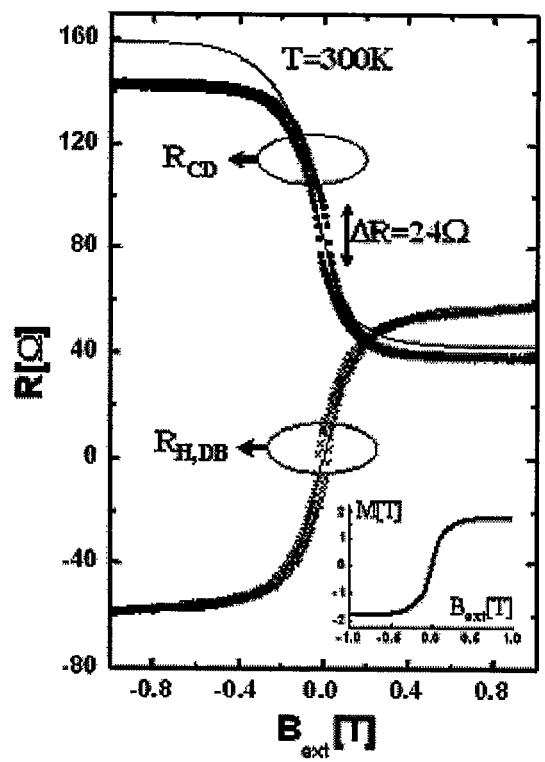
FIGS. 6a and 6b are graphs showing measured and calculated MR and Hall resistance at 300 K and 2K, in which the solid lines are calculated results using a diffusive model at 300 K and a ballistic model at 2 K.
Figure 6B:
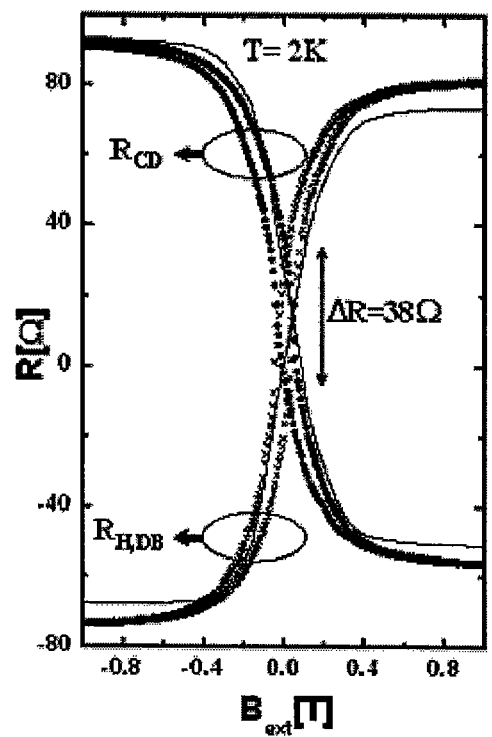

However, as shown in FIGS. 6a and 6b, although the resistance $R_{CD}$ measured depending on the external magnetic field is a typical resistance, rather than a Hall resistance, the measured data is similar to an odd-function, such as a Hall resistance, which monotonously decreases even if the direction of the magnetic field is changed. That is, the magnetoresistance linearly changes abruptly near the region where the external magnetic field is small. Particularly, the external magnetic field at 2K was positive, a negative resistance was measured. The reason for this asymmetric behavior of the MR is attributed to the junction structure of the positive and the negative magnetic-field regions near the measured voltage probes, which will be discussed later. The magnitude of the MR defined by the difference between the maximum and the minimum resistance is also large, 104 and 148 at 300 K and 2 K, respectively. The maximum current sensitivity (dR/dB) at $B_{ext} = 0$ T is about 315/T and 368/T at 300 K and 2 K, respectively.

Figure 7A:
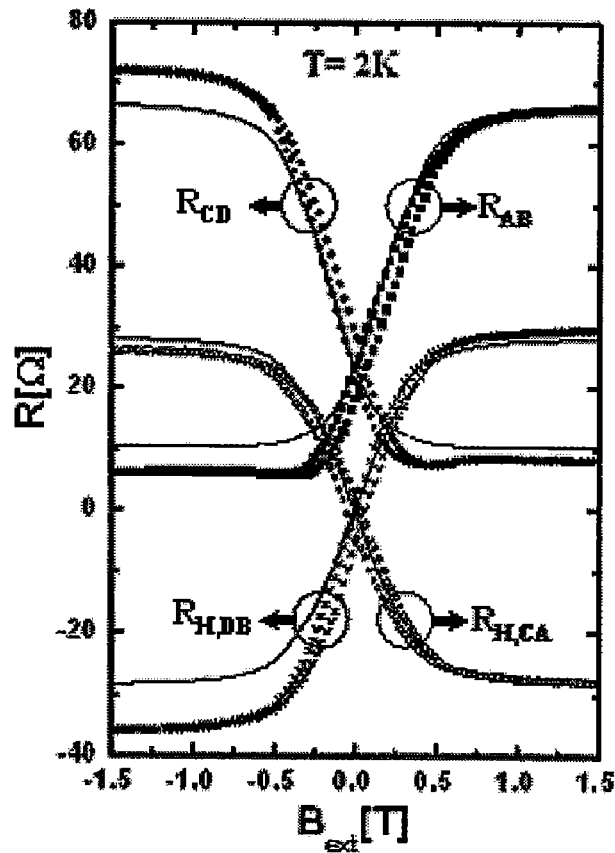
FIG. 7a is a graph showing measured and calculated MR and Hall resistance at 2 K for the S2 sample, in which the solid lines are calculated results using a diffusive model.

In order to calculate the MR numerically, one must know the normal magnetic field component ($B_z$) induced by the magnetization (M) of the micromagnets. We used a simple formula used by Vencurar et al. to obtain the Bz profile as a function of M, and we assume the relationship between M and the external magnetic field as shown in the inset of FIG. 6a. Under this assumption, all of the calculated results of sample S1, including the MR and the Hall resistance were fitted successfully to the experimental data. At 300 K, the diffusive model is used because the mean free path at 300 K is 0.46 fan, which is smaller than the device size (see real line of FIG. 6a). For sample S1 at 2 K, the ballistic model is employed because the mean free path is larger than the device size. Numerically calculated results are in excellent agreement with the experimental data. In order to investigate the origin of the MR of this device, we carried out a systematic MR and Hall resistance measurement and computer simulation for sample S2. Because the size of sample S2 is comparable to the mean free path at 2 K, diffusive transport can be expected to be the dominant mechanism. The measured data and the calculated results are in relatively good agreement with each other as shown in FIG. 7a. the two Hall resistances ($R_{H,DB}$, $R_{H,CA}$) represent a positive slope and a negative slope, respectively, and are symmetrical with respect to the y-axis. Thus, it can be seen that a negative magnetic field region and a positive magnetic field region are separated well from each other. On the other hand, two magnetoresistances ($R_{CD}$, $R_{AB}$) measured at two sides of the sample are similar to the Hall resistances, and are symmetrical to the resistance axis. Consequently, the magnetoresistance R can be approximately expressed as follows:

$$R = R_0 + R_H \quad (6)$$

Where $R_0$ is the resistance at the average gaps between the voltage probes, which is a constant not related to the magnetic field, and $R_H$ is the resistance of an odd function similar to the Hall resistance. In the diffusive model, why $R_H$ is such as above is better understood by considering the current and electric potential distribution calculated in FIG. 7c in association with the Hall angle.

Figure 7B:
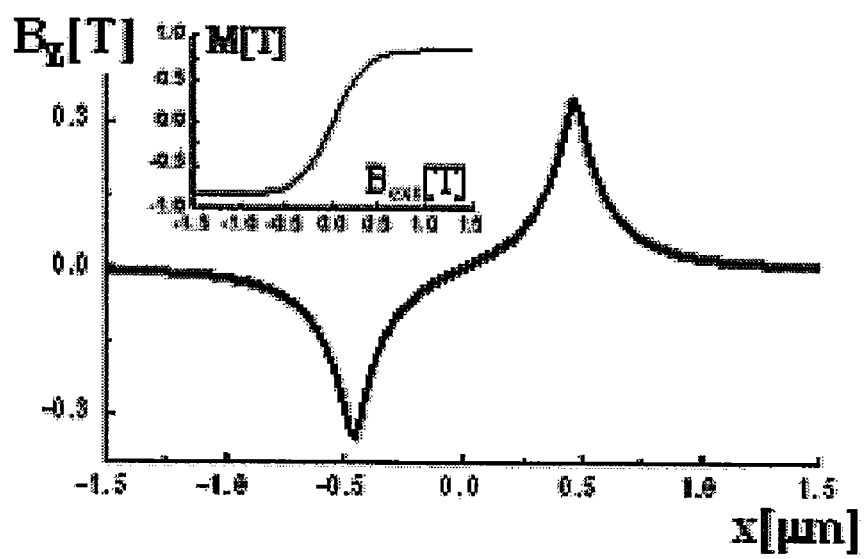
FIG. 7b is a graph showing the profile of a normal component of the magnetic field when the magnetization of the micromagnet is 1 T, in which the inset of 7(b) is a graph of the assumed functional relation between the magnetization of the micromagnet and the external magnetic field.
Figure 7C:
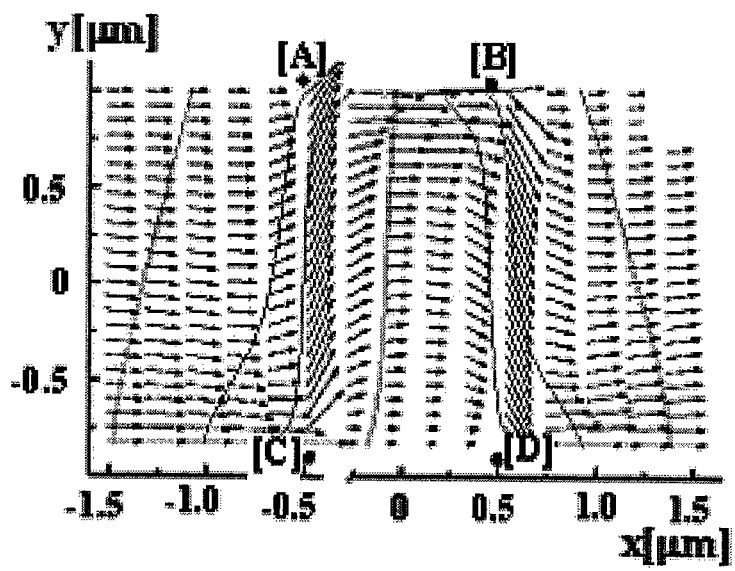
FIG. 7c shows the current distribution (small arrows) and the equipotential lines (solid lines) for the magnetic field given in 7b.

Near the magnetic barriers (near x=−0.5 μg), the Hall angle is about ±80°, and its sign is equal to the sign of the magnetic field. Bearing in mind that the direction of the electric field is normal to the equipotential line and Hall angle is nearly 90°, the current direction should be almost parallel to the equipotential lines near the barriers. That is, when the two magnetic barriers are approximated as positive and negative magnetic field regions, the current direction is parallel to the equipotential lines and the current at the positive and negative regions are opposite to each other. The overall current near the negative magnetic field region (near x=−0.5 μm in FIG. 7c) is directed to the positive y direction and piles up charges near the voltage probe [A]. The overall current near the positive magnetic field region (near x=0.5 μm in FIG. 7c) is directed to the positive y direction and piles up charges near the voltage probe [D]. Due to charge accumulation, the relative electric potentials V at the probes [A] and [D] becomes higher than those of other probes. The resistance to be measured is determined by dividing the electric potential difference between the voltage probes by a predetermined current (I) applied, and the magnetic field regions with opposite signs are formed as shown in FIG. 7b, thereby increasing $R_{AB}$ (=$V_A$−$V_B$)/I) and decreasing $R_{CD}$ (=$V_C$−$V_D$)/I). By this mechanism, one of the resistances measured at two sides of the device increases along with an increase of the external magnetic field, and the other resistance decreases. The result of the charges piled up on different sides at each magnetic field region is well supported by the result of the measurement of the Hall resistance of FIG. 7a.

Figure 8A:
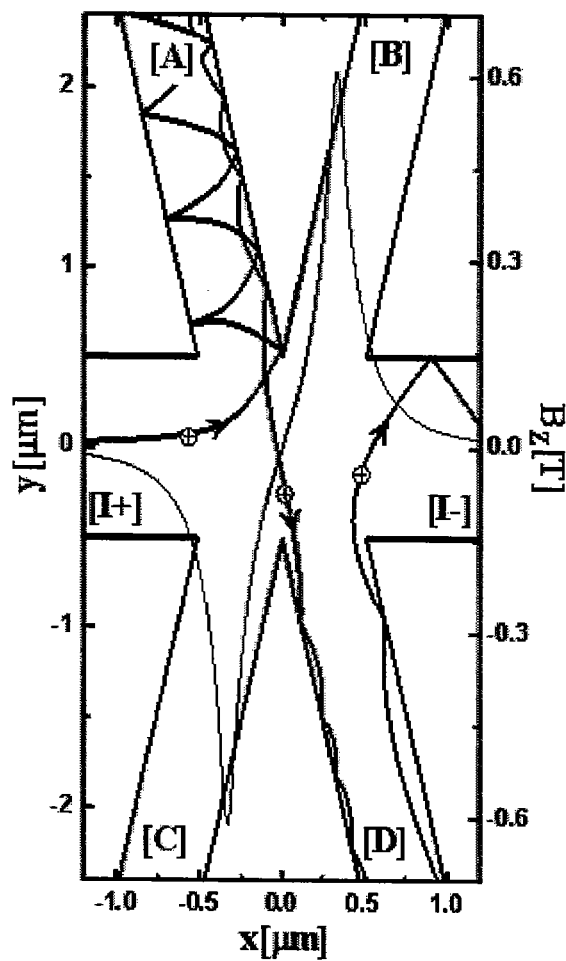
FIG. 8a shows the most probable ballistic trajectories for a particle going from terminal [I+] to [I−] in the S1 sample, wherein the thin solid line is the profile of the normal component of the magnetic field when the magnetization of the micromagnets is 1.8 Tesla.

The calculated results from the ballistic model are similar to those for the diffusive case. The difference between them is the negative value of the MR in the ballistic case. FIG. 8a shows a set of trajectories of particles calculated for sample S1. These are the most probable trajectories for a particle going from terminal [I+] to [I−]. These trajectories are assumed to be the representative ones through which the current flows approximately by ballistic motion. The particle (representative current path) going from terminal [I+] via [A] and [D] to [I−]. In this case, charged particles are also piled up at voltage probes [A] and [D]. The charged piled up at the voltage probes increase the electric potentials of [A] and [D]. Because these are resulted from the ballistic model, if $R_0$ of Equation 6 is ignored, the electric potentials of the voltage probes [A] and [D] increased by these piled-up charges contribute to the magnetoresistance in the same manner as to the Hall resistance, and thereby the Hall resistance and the magnetoresistance show very similar properties in terms of size and shape.

Figure 8B:
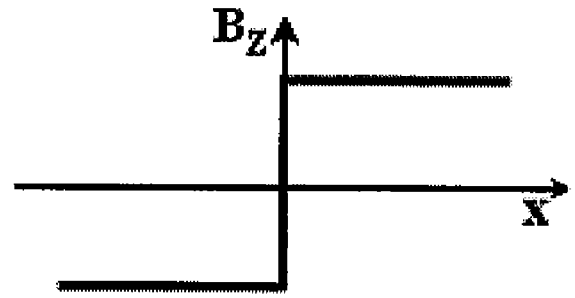
FIG. 8b is a view showing a Junction made of positive and negative magnetic-field regions when the magnetization of the micromagnet is 1 T.

The calculated results from the diffusive model and the ballistic model explained so far are in great agreement with the measured Hall resistance and magnetoresistance. The operating mechanism of the device fabricated in the present invention can be pictured simply in FIGS. 8b and 8d based on the common points between the two models. The magnetic field profile of the device felt by the carriers can be simplified to positive and negative magnetic-field regions as shown in FIG. 8b.

Figure 8C:
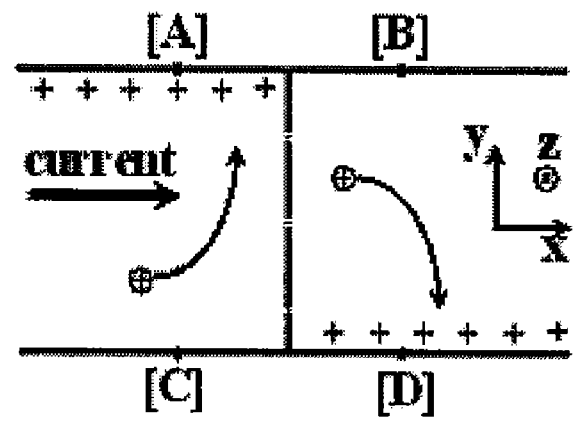
FIG. 8c is a schematic diagram illustrating the trajectories of charges in the positive and the negative field regions.
Figure 8D:
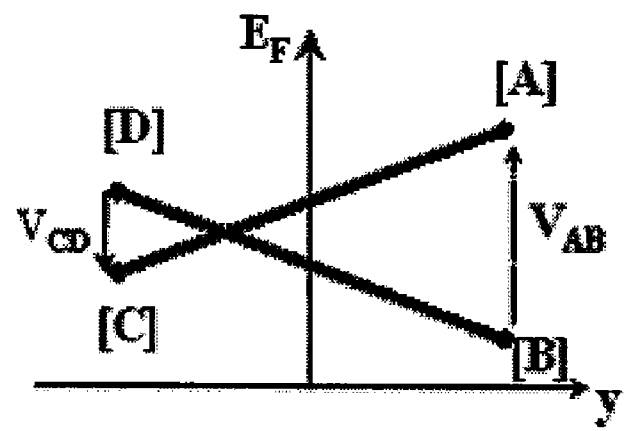
FIG. 8d is a graph showing the electrostatic voltage measured on each voltage probe.

The side (or voltage probe) of the device on which charges are piled up by the Lorentz force is determined by the direction of the magnetic field. An opposite direction of the field on each region cause a charge accumulation on the opposite side (or voltage probe). As a result, as shown in FIG. 8c, charges pile up at the voltage probes [A] and [d]. The relative electric potentials of these probes are larger than those of other voltage probes as shown in FIG. 8d. Especially, in the ballistic model, the resistance ($R_0$ of Equation (6)) at the average gaps between the voltage probes) is ignored, so the electric potential $V_D$ at [D] is larger than the electric potential $V_C$ at [C], and the measured resistance ($R_{CD}$=($V_C$−$V_D$) is a negative value. Consequently, the magnetoresistance property exhibited in the device fabricated in the present invention can be explained that it is based on the Hall effect, and is the property made by a combination of two Hall effects in one device.

Application of Fabricated Device

The technology of junction of positive and negative magnetic field regions that is obtained in the present invention is the core technology that is directly applicable to a unipolar spin device based on a spin up/down junction. The device fabricated in the present invention can be applied to various fields in addition to the unipolar spin device, and a description thereof is as follows. If a spatial variation is not zero because of a local magnetic field (i.e., ∂B/∂x≠0), a spin up/down receives a force in the opposite directions from each other. By using this, the device fabricated in the present invention can be applied to a spin filter.

The measured MRs show hysteresis behavior caused by magnetization of the micromagnets. According to the history of the magnetization, two values of the resistance are possible in the absence of an external magnetic field, whose difference is ΔMR. The value of ΔMR, as shown in FIGS. 6a and 6b, are 24Ω and 38Ω at 300 K and 2 K, respectively. These relatively large values of ΔMR indicate an application as a MRAM (Magnetic Random Access Memory). A MRAM device using a hybrid ferromagnet-semiconductor structure was first proposed by Johnson et al. However, that device has some difficulties in applications as a high density device because it uses a Hall resistance. Because the device fabricated in the present invention uses a conventional resistance, i.e., voltage probes located only one side of the device, a high-density MRAM can be achieved by using our device.

Figure 9:
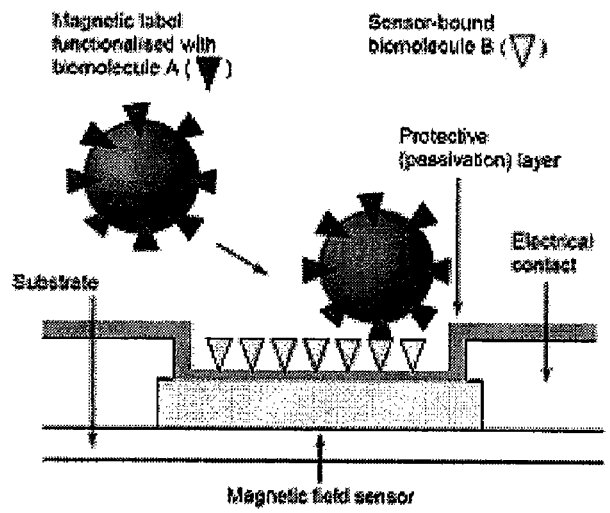
FIG. 9 is a schematic diagram showing the principle of a biomolecule sensor.

Regarding the sensor application, on the other hand, the variation of the resistance for an external magnetic field is quite asymmetric and similar to the Hall resistance; thus, it can detect the direction of the field, as well as the field strength, and, as described above, shows a large sensitivity (dR/dB) at a region with a small external magnetic field, so that it is expected to be an excellent magnetic sensor. Especially, the application as a biomolecule sensor using a magnetic bead, which is recently popular, is attracting attention. The principle of the biomolecule sensor is well depicted in FIG. 9, and the biomolecule sensor can be understood as a small and sensitive magnetic field sensor. Bearing in mind that the size of the sensor part of this device is about 1 μm, and the size of a commercialized and generally used magnetic bead is 0.5 to 5 μm, this device can be used as a single magnetic bead sensing device.

At present, the representative devices attracting attention as a solid state biomolecule sensor include a magnetic metal-based spin valve type device and a semiconductor-based hall sensor. The present device has several advantages over these devices, which will be summarized as follows.

First, the advantages over the existing spin valve type device will be described.

In order to detect magnetic beads, firstly, these have to be magnetized by an external magnetic field. The magnetic field required for the magnetization of commercialized magnetic beads ranges from 100 to 1000 Oe. However, a GMR or TMR spin valve type device has some difficulties in using as a magnetic bead sensor because they are already saturated in such a magnetic field. Moreover, in the spin valve type device, signals resulting from the magnetic field are nonlinear. That is, device signals for sensing the strength of the stray field coming from the magnetic beads become abruptly nonlinear, so there is difficulty in sensing the number or position of the magnetic beads. However, as seen from the measured data, the magnetoresistance, which is a device signal, is linear within the range of about ±1500 Oe, thus the above-said disadvantages of the spin valve type device can be overcome.

Next, the advantages over the existing hall sensor will be described.

The hall sensor forms a cross shape with voltage probes being located at both sides of a current channel. Due to such a type of voltage probe construction, the area occupied by one device is relatively large. Thus, in case of fabricating an integrated device having an array structure, the overall area may be larger. FIG. 1 is an one-dimensional array structure of a biomolecule sensor using a hall device that has been recently launched.

Figure 10A:
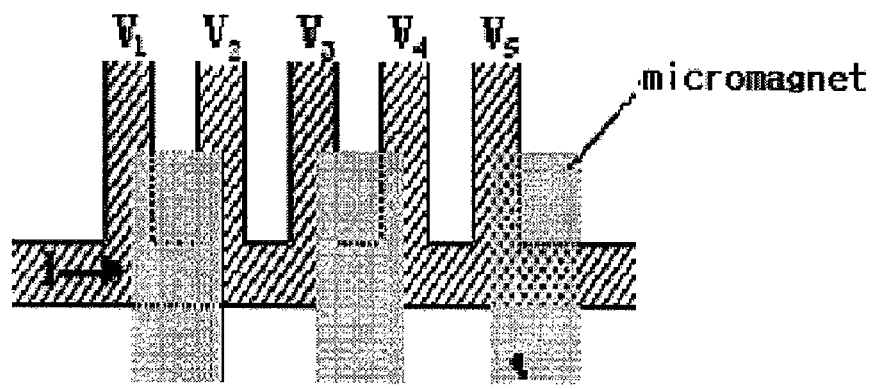
FIGS. 10a and 10b are a plane view and cross sectional view, respectively, of a hybrid semiconductor-ferromagnet device according to another embodiment of the present invention.
Figure 10B:
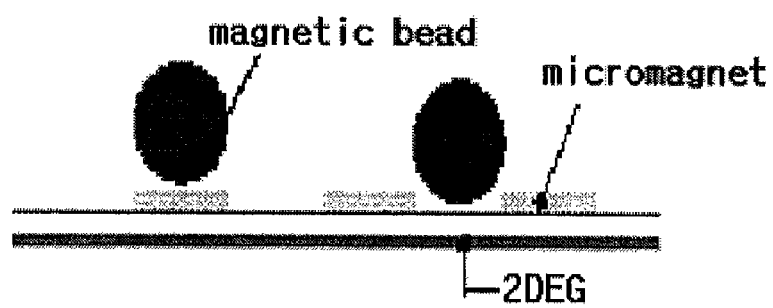

However, in case that an one-dimensional array performing the same function by the device suggested in the present invention is configured, the device as shown in FIGS. 10a and 10b can be fabricated.

Referring to FIGS. 10a and 10b, the device suggested in the present invention includes a channel through which current flows, a semiconductor 2DEG having a plurality of voltage probes perpendicularly connected to one side of the channel, and micromagnets located alternately on the channel area between the two neighboring voltage probes.

Preferably, the two neighboring voltage probes are formed at the positions corresponding to the minimum and maximum heights, respectively, of two magnetic barriers with different signs that are formed in the channel as an external magnetic field is applied.

In case the voltage probes $V_1$ and $V_2$ are measured, they have the same shape with the sample S2 fabricated in the present invention because there are micromagnets between the voltage probes. That is, in case that the micromagnets are located on the channel region between the two neighboring voltage probes, as an external magnetic field is applied, a junction surface of positive and negative magnetic field regions is formed on the channel area between the two neighboring voltage probes.

If the voltage probes $V_3$ and $V_4$ are measured, the voltage probes of the sample S1 and the micromagnets have the same configuration. That is, if the micromagnets are not located on the channel region between the two neighboring voltage probes, as an external magnetic field is applied, a junction surface of positive and negative magnetic field regions is formed on the channel area between the two neighboring voltage probes.

In this way, the area of the current channel between the voltage probes forms a unit device of an one-dimensional array as one magnetic field sensor. Such a structure is of a type in which the number of voltage probes is reduced by a half, as compared to a structure (FIG. 1) using the existing hall sensor. Moreover, since the arrangement of the voltage probes is located at only one side of the current channel, the overall size of the device can be reduced.

Meanwhile, the device suggested in the present invention is similar to the existing hall sensor from the aspect that it is basically induced by a hall voltage. However, the micromagnets located on the current channel functions to amplify the size of the magnetic field desired to be detected, so the sensitivity of a signal is larger than that of the existing hall sensor. Therefore, the biomolecule sensory array suggested in the present invention is advantageous in that its sensitivity is larger than that of the hall sensor, and the complexity and size of the device can be reduced to a half of the hall sensor.

According to the present invention, a hybrid semiconductor-ferromagnet device with a junction structure of positive and negative magnetic field regions can be fabricated, and such a device can be applied to a high integrated magnetic field sensor, a memory device, etc, as well as a unipolar spin device.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A hybrid semiconductor-ferromagnet device with a junction structure of positive and negative magnetic field regions, comprising:
    a semiconductor 2DEG (2-Dimensional Electron Gas) having a channel, through which current flows; and
    two micromagnets with a predetermined interval on the same plane located on the semiconductor 2DEG,
    wherein two magnetic barriers with different signs are formed in the semiconductor 2DEG under the portion where the two micromagnets face each other as an external magnetic field is applied,
    wherein the semiconductor 2DEG includes InAs or HgCdTe, and
    wherein the junction surface between the positive and negative magnetic field regions may be a spin up-down junction of electrons.

2. The hybrid semiconductor-ferromagnet device of claim 1, further comprising positive and negative voltage probes connected to the positive and negative magnetic field regions, respectively, of one side of the channel.

3. The hybrid semiconductor-ferromagnet device of claim 2, wherein the positive and negative voltage probes are formed integral with the channel.

4. The hybrid semiconductor-ferromagnet device of claim 2, wherein the positive and negative voltage probes are formed at the positions where the magnetic barriers are maximum and minimum.

5. The hybrid semiconductor-ferromagnet device of claim 4, wherein the positive and negative voltage probes are formed in a "V"-shape, and the "average distance" therebetween is consistent with the position at which the height of the magnetic barrier is the maximum and minimum.

6. The hybrid semiconductor-ferromagnet device of claim 4, wherein the positive and negative voltage probes are normal to the channel, respectively.

7. The hybrid semiconductor-ferromagnet device of claim 1, wherein an insulating layer is interposed between the micromagnets and the semiconductor 2DEG.

8. The hybrid semiconductor-ferromagnet device of claim 7, wherein the thickness of the insulating layer is smaller that the thickness of the micromagnets.

9. The hybrid semiconductor-ferromagnet device of claim 1, wherein the distance between the two micromagnets is 0.1 to 1.0 μm.

10. The hybrid semiconductor-ferromagnet device of claim 1, wherein the widths of the micromagnets is larger than the width of the channel.

11. The hybrid semiconductor-ferromagnet device of claim 1, wherein the micromagnets include one selected from the group consisting of Co, CoPt, CoFe, FeNi, CoFeB, CoZrB, and FePt.

12. A hybrid semiconductor-ferromagnet device with a junction structure of positive and negative magnetic field regions, comprising:
   a semiconductor 2DEG having a channel, through which current flows; and
   a micromagnet intersecting the channel located on the semiconductor 2DEG,
   wherein two magnetic barriers with different signs are formed in the semiconductor 2DEG under the micromagnet as an external magnetic field is applied,
   wherein the semiconductor 2DEG includes InAs or HgCdTe, and
   wherein the junction surface between the positive and negative magnetic field regions may be a spin up-down junction of electrons.

13. The hybrid semiconductor-ferromagnet device of claim 12, further comprising positive and negative voltage probes connected to the positive and negative magnetic field regions, respectively, of one side of the channel.

14. The hybrid semiconductor-ferromagnet device of claim 13, wherein the positive and negative voltage probes are formed at the positions where the magnetic barriers are maximum and minimum.

15. The hybrid semiconductor-ferromagnet device of claim 13, wherein the positive and negative voltage probes are formed integral with the channel.

16. The hybrid semiconductor-ferromagnet device of claim 12, wherein an insulating layer is interposed between the micromagnets and the semiconductor 2DEG.

17. A hybrid semiconductor-ferromagnet device with a junction structure of positive and negative magnetic field regions, comprising:
   a semiconductor 2DEG having a channel, through which current flows, and a plurality of voltage probes perpendicularly connected to one side of the channel; and
   micromagnets located alternately on the channel area between the two neighboring voltage probes,
   wherein the semiconductor 2DEG includes InAs or HgCdTe, and
   wherein the junction surface between the positive and negative magnetic field regions may be a spin up-down junction of electrons.

18. The hybrid semiconductor-ferromagnet device of claim 17, wherein the two neighboring voltage probes are formed at the positions where the magnetic barriers are minimum or maximum, respectively, of two magnetic barriers with different signs that are formed in the channel as an external magnetic field is applied.

19. The hybrid semiconductor-ferromagnet device of claim 17, wherein if the micromagnets are located on the channel region between the two neighboring voltage probes, as an external magnetic field is applied, a junction surface of positive and negative magnetic field regions is formed on the channel area between the two neighboring voltage probes.

20. The hybrid semiconductor-ferromagnet device of claim 17, wherein if the micromagnets are not located on the channel region between the two neighboring voltage probes, as an external magnetic field is applied, a junction surface of positive and negative magnetic field regions is formed on the channel area between the two neighboring voltage probes.

21. The hybrid semiconductor-ferromagnet device of claim 17, wherein an insulating layer is interposed between the micromagnets and the semiconductor 2DEG.

22. The hybrid semiconductor-ferromagnet device of claim 17, wherein the semiconductor 2DEG includes InAs or HgCdTe.

* * * * *